(12) United States Patent
Lin

(10) Patent No.: US 7,863,934 B2
(45) Date of Patent: Jan. 4, 2011

(54) ADJUSTING METHOD AND CIRCUIT USING THE SAME

(75) Inventor: Yung-Feng Lin, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/144,723

(22) Filed: Jun. 24, 2008

(65) Prior Publication Data

US 2009/0315589 A1    Dec. 24, 2009

(51) Int. Cl.
*H03K 19/094* (2006.01)
(52) U.S. Cl. .................... 326/82; 327/94; 341/122; 341/142
(58) Field of Classification Search .................... 326/32, 326/82; 327/50, 91, 94; 341/122–126, 142
See application file for complete search history.

(56) References Cited

U.S. PATENT DOCUMENTS

| | | | |
|---|---|---|---|
| 6,407,687 B2* | 6/2002 | Martin et al. ............... | 341/122 |
| 7,102,559 B2* | 9/2006 | Van Tuijl .................... | 341/156 |
| 7,109,902 B2* | 9/2006 | Guidry et al. ............... | 341/122 |
| 7,236,117 B1* | 6/2007 | Varma et al. ................ | 341/155 |
| 2007/0252744 A1* | 11/2007 | Takeuchi .................... | 341/155 |
| 2009/0015451 A1* | 1/2009 | Toyomura et al. ........... | 341/122 |

* cited by examiner

*Primary Examiner*—James H. Cho
*Assistant Examiner*—Jason M Crawford
(74) *Attorney, Agent, or Firm*—Thomas, Kayden, Horstemeyer & Risley

(57) ABSTRACT

A method adjusts driving ability of an output buffer. The output buffer has multiple driving ability classes. The method includes the following steps. First, the driving ability of the output buffer is initialized as an initial class among the driving ability classes. Next, a voltage at an output terminal of the output buffer is initialized to an initial voltage. Then, an input voltage is inputted via the input terminal at a first time instant. Next, an output voltage outputted from the output terminal is sampled to obtain a voltage value at a second time instant. Then, whether the voltage value satisfies a predetermined condition is judged. Next, if the voltage value satisfies the predetermined condition, the driving ability class of the output buffer is recorded and set.

21 Claims, 5 Drawing Sheets

ADJUSTING METHOD AND CIRCUIT USING THE SAME

BACKGROUND OF THE INVENTION

1. Field of the Invention

The invention relates in general to a circuit adjusting method and an adjusting circuit, and more particularly to an adjusting method and an adjusting circuit for adjusting driving ability of an output buffer.

2. Description of the Related Art

In the modern age having the technological development, which changes with each passing day, existing output buffers have been widely used in various occasions. The present output buffer adjusts an output signal from its initial level to a readable high reference level or a readable low reference level according to an input signal in a signal value determining period. In other words, the output buffer needs to have a specific output slew rate so as to adjust the level of the output signal in the signal value determining period.

Generally speaking, the output slew rate of the output buffer relates to parameters, such as process, voltage, temperature and capacitance-loading (PVTC) parameters. Conventionally, the PVTC parameters for the circuit of the output buffer are designed in the worst case circuit environment in order to ensure that the output buffer can adjust the level of the output signal in the signal value determining period and any circuit environment.

In the typical condition, however, most circuit environments, to which the output buffer is actually applied, are much better than the worst case circuit environment. Therefore, the conventional output buffer, which is designed according to the worst case, can provide the circuit driving ability far greater than that required in this application environment. So, the output buffer has the drawbacks including the higher power noise, the higher power consumption and the higher electromagnetic interference (EMI).

SUMMARY OF THE INVENTION

The invention is directed to an adjusting method and an adjusting circuit for adjusting driving ability of an output buffer. Compared with the conventional output buffer, the output buffer using the adjusting method and the adjusting circuit according to the invention has the advantages including the lower power noise, the lower power consumption and the lower electromagnetic interference (EMI).

According to a first aspect of the present invention, a method for adjusting driving ability of an output buffer is provided. The output buffer has a plurality of driving ability classes. The adjusting method includes the following steps. First, driving ability intensity of the output buffer is initialized as an initial class among the driving ability classes. Next, a voltage on an output terminal of the output buffer is initialized as an initial voltage. Then, an input voltage is inputted via the input terminal at a first time instant. Next, an output voltage outputted from the output terminal is sampled to obtain a voltage value at a second time instant. Then, whether the voltage value satisfies a predetermined condition is judged. Next, the driving ability class of the output buffer is recorded and set if the voltage value satisfies the predetermined condition.

According to a second aspect of the present invention, a circuit for adjusting a driving ability of an output buffer, which generates an output voltage according to an input voltage, is provided. The output buffer has a plurality of driving ability classes, and driving ability intensity of the output buffer is preset as an initial class. The circuit includes a sample and hold circuit, a comparator circuit and a logic circuit. The sample and hold circuit coupled to an output terminal of the output buffer receives the output voltage and samples the output voltage to obtain a voltage value in response to a driving edge of a first clock signal. The comparator circuit compares the voltage value with a threshold voltage value to generate a comparison signal. The logic circuit judges whether the voltage value satisfies a predetermined condition or not according to the comparison signal, and thus generates a selection signal for adjusting the driving ability class of the output buffer, and further provides the control signal.

The invention will become apparent from the following detailed description of the preferred but non-limiting embodiments. The following description is made with reference to the accompanying drawings.

DETAILED DESCRIPTION OF THE INVENTION

The adjusting method of this embodiment is used to adjust driving ability of an output buffer when the output buffer is disposed in a circuit environment applied thereto.

Figure 1:
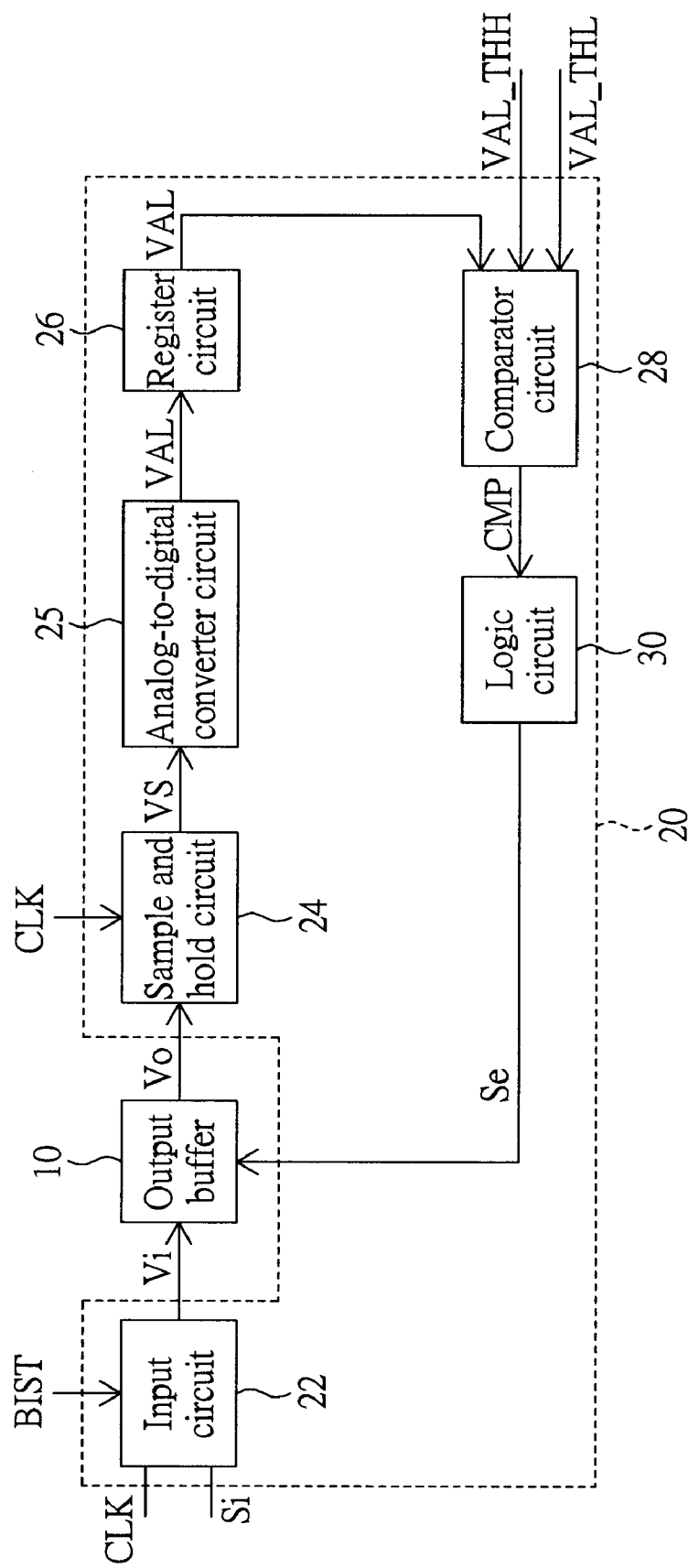
FIG. 1 is a block diagram showing an adjusting circuit according to an embodiment of the invention.
Figure 2:
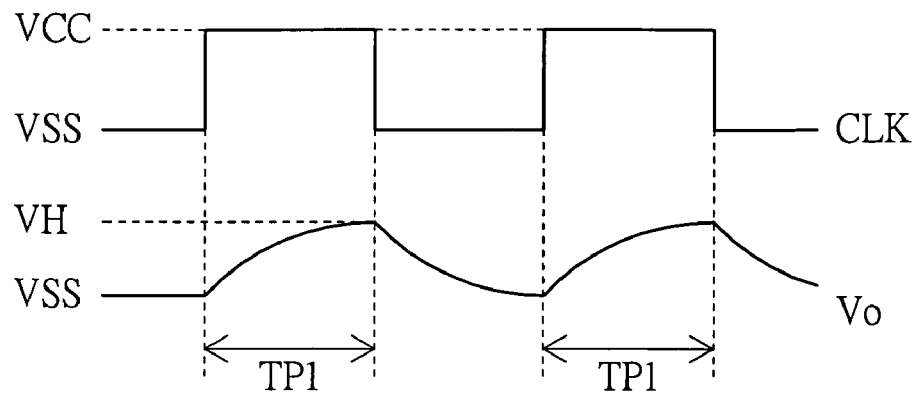
FIG. 2 is a timing chart showing associated signals of the adjusting circuit of FIG. 1.

FIG. 1 is a block diagram showing an adjusting circuit 20 according to an embodiment of the invention. FIG. 2 is a timing chart showing associated signals of the adjusting circuit 20 of FIG. 1. As shown in FIGS. 1 and 2, the adjusting circuit 20 is for adjusting driving ability of an output buffer 10. The output buffer 10 may be, for example, a clock-based output buffer having a value determining period associated with a reference clock signal. For example, the value determining period of the output buffer 10 is substantially equal to a half cycle of a clock signal CLK. In other words, the output buffer 10 adjusts an output voltage Vo from its initial level to a high level judging voltage VOH or a low level judging voltage VOL in one half cycle of the clock signal CLK so that the circuit following and coupled to the output buffer 10 can operate according to the output voltage Vo.

Figure 3:
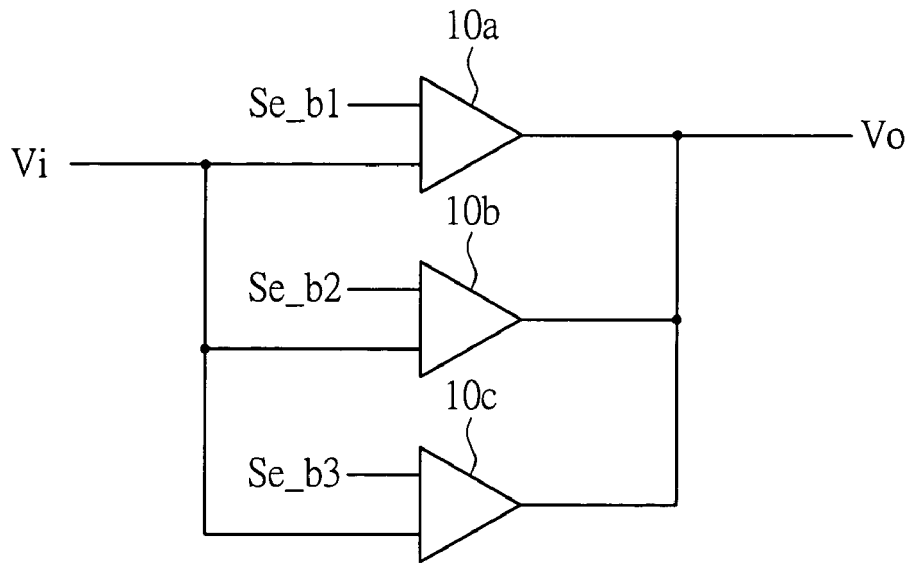
FIG. 3 is a schematic illustration showing an output buffer of an adjusting circuit using the embodiment of the invention.

The output buffer 10 has many driving ability classes. FIG. 3 is a schematic illustration showing the output buffer of the adjusting circuit using the embodiment of the invention. For example, the output buffer 10 has driving units $10a$, $10b$ and $10c$, and the driving ability Driv(a), Driv(b) and Driv(c) of the driving units $10a$, $10b$ and $10c$ satisfy the condition:

$$\text{Driv}(a):\text{Driv}(b):\text{Driv}(c)=1:2:4.$$

The driving units $10a$, $10b$ and $10c$ are respectively enabled in response to the values of a first bit signal Se_b1, a second bit signal Se_b2 and a third bit signal Se_b3 of a selection signal Se and thus generate an output signal in response to the signal received by its input terminal. Consequently, the driving ability of the output buffer 10 may be correspondingly equal to 1 to 7 times that of the driving unit 10*a* in response to the values $(001)_2$ to $(111)_2$ of the selection signal Se. The driving ability of the output buffer 10 is preset as an initial class. For example, the initial class corresponds to the minimum driving ability of the output buffer 10, and thus corresponds to the driving ability class of the selection signal Se having the value $(001)_2$.

The adjusting circuit 20 includes an input circuit 22, a sample and hold circuit 24, an analog-to-digital converter circuit 25, a register circuit 26, a comparator circuit 28 and a logic circuit 30. The input circuit 22 is coupled to an input terminal of the output buffer 10 and provides an input voltage Vi inputted to the output buffer 10 in response to a first level of a control signal BIST. The output buffer 10 generates the output voltage Vo according to the input voltage Vi.

The sample and hold circuit 24 is coupled to an output terminal of the output buffer 10 and receives the output voltage Vo. The sample and hold circuit 24 samples the output voltage Vo to obtain a voltage value VAL in response to a driving edge of the clock signal CLK. The cycle of the clock signal CLK relates to the length of the value determining period of the output buffer 10.

Taking an actual operation for example, initial voltages of the input voltage Vi and the output voltage Vo are equal to a low voltage VSS. In the time period TP1, the input circuit 22 provides the high voltage VCC of the clock signal CLK as the input voltage Vi to the output buffer 10 in response to the first level of the control signal BIST. Consequently, the output buffer 10 increases the output voltage Vo to a high voltage VH approaching the high voltage VCC according to the input voltage Vi. The sample and hold circuit 24 samples the output voltage Vo to obtain a sampled voltage VS in response to a falling edge of the clock signal CLK.

The analog-to-digital converter circuit 25 converts the sampled voltage VS into the voltage value VAL. The comparator circuit 28 receives the voltage value VAL and an upper-bound voltage value VAL_THH, and compares the voltage value VAL with the upper-bound voltage value VAL_THH to correspondingly generate a comparison signal CMP. For example, the upper-bound voltage value VAL_THH may be a voltage value obtained by the analog-to-digital converter circuit 25, which performs analog-to-digital conversion according to the high level judging voltage VOH. It is possible to judge whether the high voltage VH is substantially greater than the high level judging voltage VOH by comparing the voltage value VAL with the upper-bound voltage value VAL_THH.

The logic circuit 30 judges whether the voltage value VAL satisfies a predetermined condition according to the comparison signal CMP, and the logic circuit 30 generates the selection signal Se including the first, second and third bit signals Se_b1, Se_b2 and Se_b3 to adjust the driving ability class of the output buffer 10. For example, while the voltage Vo is transferring from low voltage (=the low voltage VSS) to high voltage (=the high voltage VH), the predetermined condition is that the voltage value VAL is substantially greater than the upper-bound voltage value VAL_THH. When the predetermined condition is satisfied, it represents that the output buffer 10 has the sufficient driving ability for increasing the output voltage Vo from the low voltage VSS to the voltage higher than the high level judging voltage VOH in the value determining period. At this time, the logic circuit 30 records and sets the driving ability class of the output buffer 10 as the initial class.

When the predetermined condition is not satisfied, it represents that the driving ability of the output buffer 10 is insufficient to increase the output voltage Vo from the low voltage VSS to the voltage higher than the high level judging voltage VOH in the value determining period. At this time, the logic circuit 30 adds 1 to the value of the selection signal Se (i.e., the value of the selection signal Se is set to $(010)_2$), and then the sample and hold operation, the digital-to-analog conversion operation, the comparing operation and the logic control operation are repeated until the voltage value VAL satisfies the predetermined condition.

Consequently, the adjusting circuit 20 of this embodiment can effectively adjust the driving ability of the output buffer 10 according to a voltage driving condition of the output buffer 10 in the actual application circuit, and thus effectively set the driving ability of the output buffer 10 to the lowest driving ability for finishing the voltage driving in the value determining period.

In this embodiment, only the operation of the output buffer 10 performed according to the input voltage Vi equal to the high voltage VCC is described. However, the output buffer 10 is not limited thereto.

Figure 4:
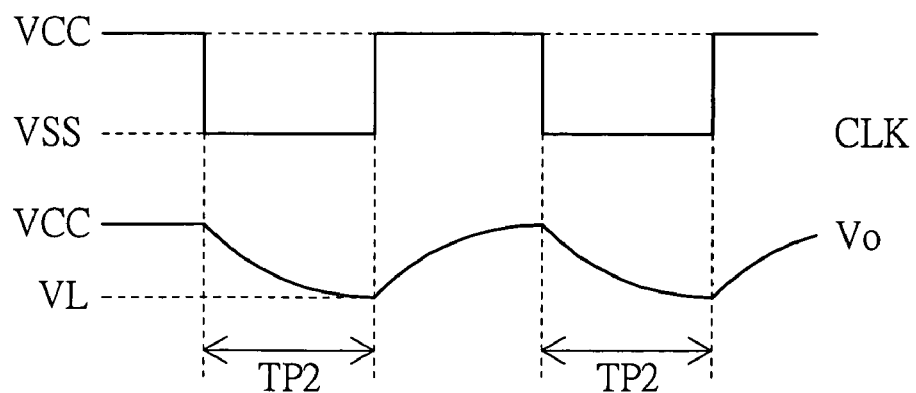
FIG. 4 is a timing chart showing other associated signals of the adjusting circuit of FIG. 1.

FIG. 4 is a timing chart showing other associated signals of the adjusting circuit of FIG. 1. In another operation example, as shown in FIG. 4, the initial voltages of the input voltage Vi and the output voltage Vo are set as the high voltage VCC, and the input circuit 22 provides the input voltage Vi equal to the low voltage VSS to the output buffer 10 in response to the first level of the control signal BIST. Therefore, similar to the above-mentioned operation, the output buffer 10 can decrease the output voltage Vo to a low voltage VL according to the input voltage Vi equal to the low voltage VSS. The adjusting circuit 20 performs the sample and hold operation and the digital-to-analog conversion operation to obtain the voltage value VAL according to the low voltage VL.

The comparator circuit 28 further receives a lower-bound voltage value VAL_THL, which is a substantially voltage value obtained by the analog-to-digital conversion according to the low level judging voltage VOL. The logic circuit 30 judges whether the voltage value VAL satisfies the predetermined condition according to the comparison signal CMP, and accordingly generates the selection signal Se to adjust the driving ability class of the output buffer 10. For example, while the voltage Vo is transferring from high voltage (=the high voltage VSS) to low voltage (=the low voltage VL), the predetermined condition is that the voltage value VAL is substantially lower than the lower-bound voltage value VAL_THL.

Figure 5A:
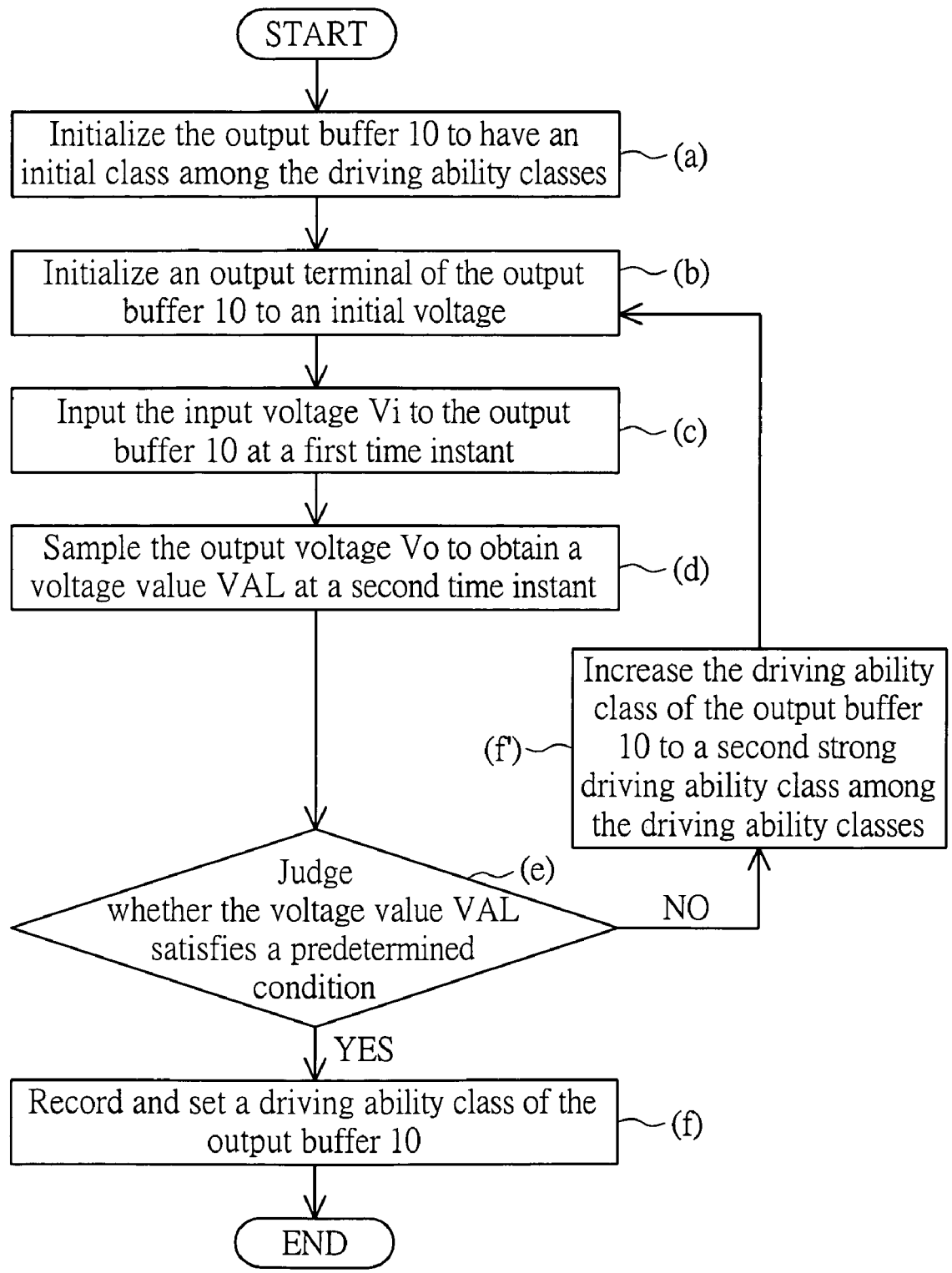
FIG. 5A is a flow chart showing an adjusting method according to the embodiment of the invention.

FIG. 5A is a flow chart showing an adjusting method according to the embodiment of the invention. As shown in step (a), the driving ability intensity of the output buffer 10 is initialized to the initial class corresponding to the weakest driving ability. Next, as shown in step (b), the output voltage Vo is initialized to the initial voltage, such as the low voltage VSS or the high voltage VDD.

Then, as shown in step (c), the input circuit 22 provides the input voltage Vi to the output buffer 10 at a first time instant. In one operation example, the first time instant is an initial time instant of the time period TP1, and the input voltage Vi is equal to the high voltage VCC of the clock signal CLK. In another operation example, the first time instant is an initial time instant of the time period TP2, and the input voltage Vi is equal to the low voltage VSS of the clock signal CLK.

Next, as shown in step (d), the sample and hold circuit 24 samples the output voltage Vo to obtain the voltage value VAL at a second time instant, which is the time instant after the first time instant by the value determining period. The second time instant is an ending time instant of the time period TP1, and the value determining period is equal to the time period TP1, for example.

Then, as shown in step (e), the comparator circuit 28 judges whether the voltage value VAL is higher than the upper-bound voltage value VAL_THH to accordingly generate the comparison signal CMP. The logic circuit 30 judges whether the voltage value VAL satisfies the predetermined condition according to the comparison signal CMP. If the voltage value VAL satisfies the predetermined condition, step (f) is performed so that the logic circuit 30 records and sets the driving ability class of the output buffer 10 as the initial class.

After the step (e), if the voltage value VAL does not satisfy the predetermined condition, step (f') is performed so that the logic circuit 30 increases the driving ability class of the output buffer 10 to a second strong driving ability class among the driving ability classes and then the step (b) is performed. For example, the present driving ability class is the initial class corresponding to the selection signal Se with the value $(001)_2$, and the second strong driving ability class is the driving ability class corresponding to the selection signal Se with the value $(010)_2$.

Figure 5B:
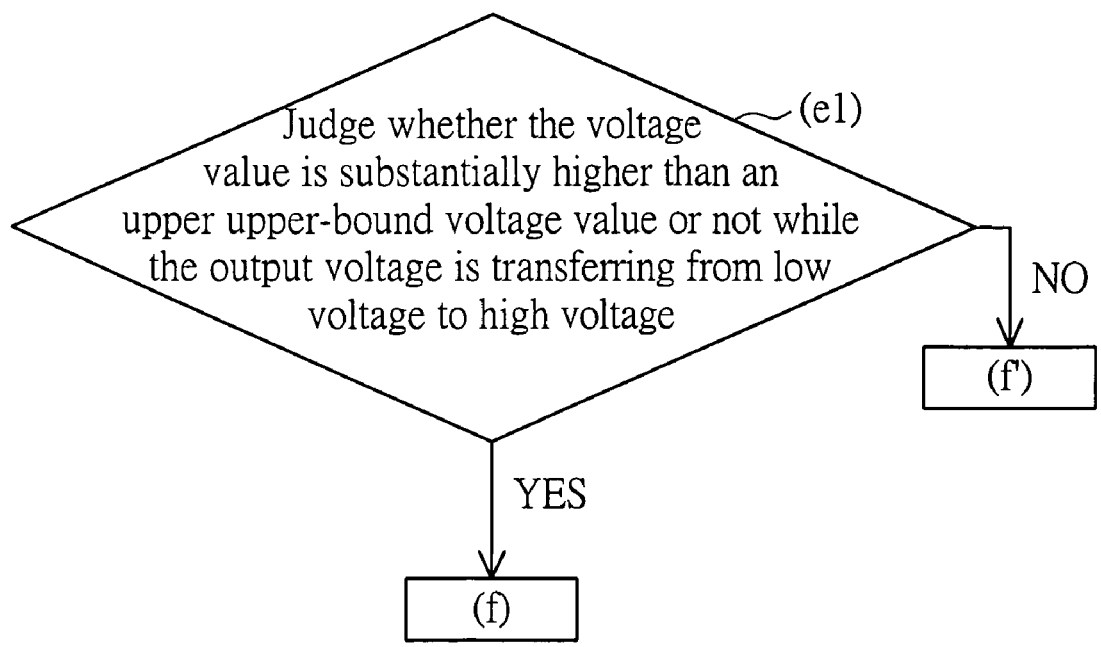
FIGS. 5B and 5C are flow charts showing partial steps of the adjusting method according to this embodiment of the invention.

In one operation example, the voltage Vo is transferring from low voltage to high voltage, and the predetermined condition is that the voltage value VAL is higher than the upper-bound voltage value VAL_THH. Thus, as shown in FIG. 5B, the step (e) includes step (e1), in which the logic circuit 30 judges whether the voltage value VAL is substantially higher than the upper-bound voltage value VAL_THH according to the comparison signal CMP. When the logic circuit 30 judges that the voltage value VAL is higher than the upper-bound voltage value VAL_THH, the step (f) is performed. When the voltage value VAL is lower than the upper-bound voltage value VAL_THH, the step (f') is performed.

Figure 5C:
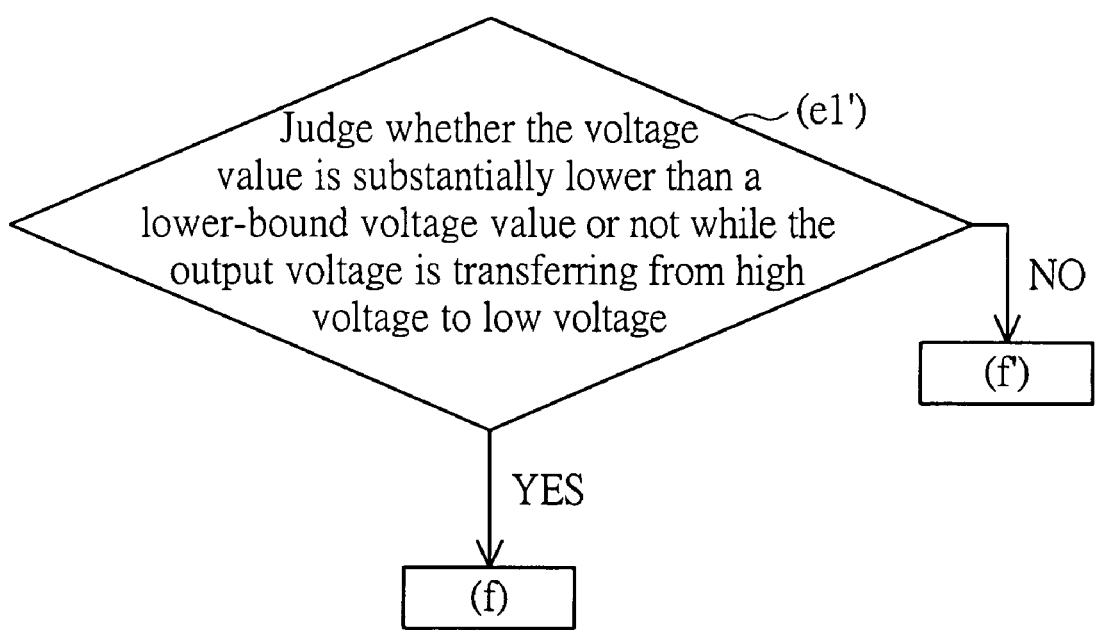

In another operation example, the voltage Vo is transferring form high voltage to low voltage, and the predetermined condition is that the voltage value VAL is lower than the lower-bound voltage value VAL_THL. Thus, as shown in FIG. 5C, the step (e) includes step (e1'), in which the logic circuit 30 judges whether the voltage value VAL is substantially lower than the lower-bound voltage value VAL_THL according to the comparison signal CMP. When the logic circuit 30 judges that the voltage value VAL is lower than the lower-bound voltage value VAL_THL, the step (f) is performed. When the voltage value VAL is higher than the lower-bound voltage value VAL_THL, step (f') is performed.

In the illustrated example of this embodiment, the adjusting circuit 20 provides the high voltage VCC or the low voltage VSS of the clock signal CLK as the input voltage Vi to the output buffer 10. However, the adjusting circuit 20 of this embodiment is not limited to the provision of the steady-state voltage of the clock signal CLK as the input voltage Vi.

Figure 6:
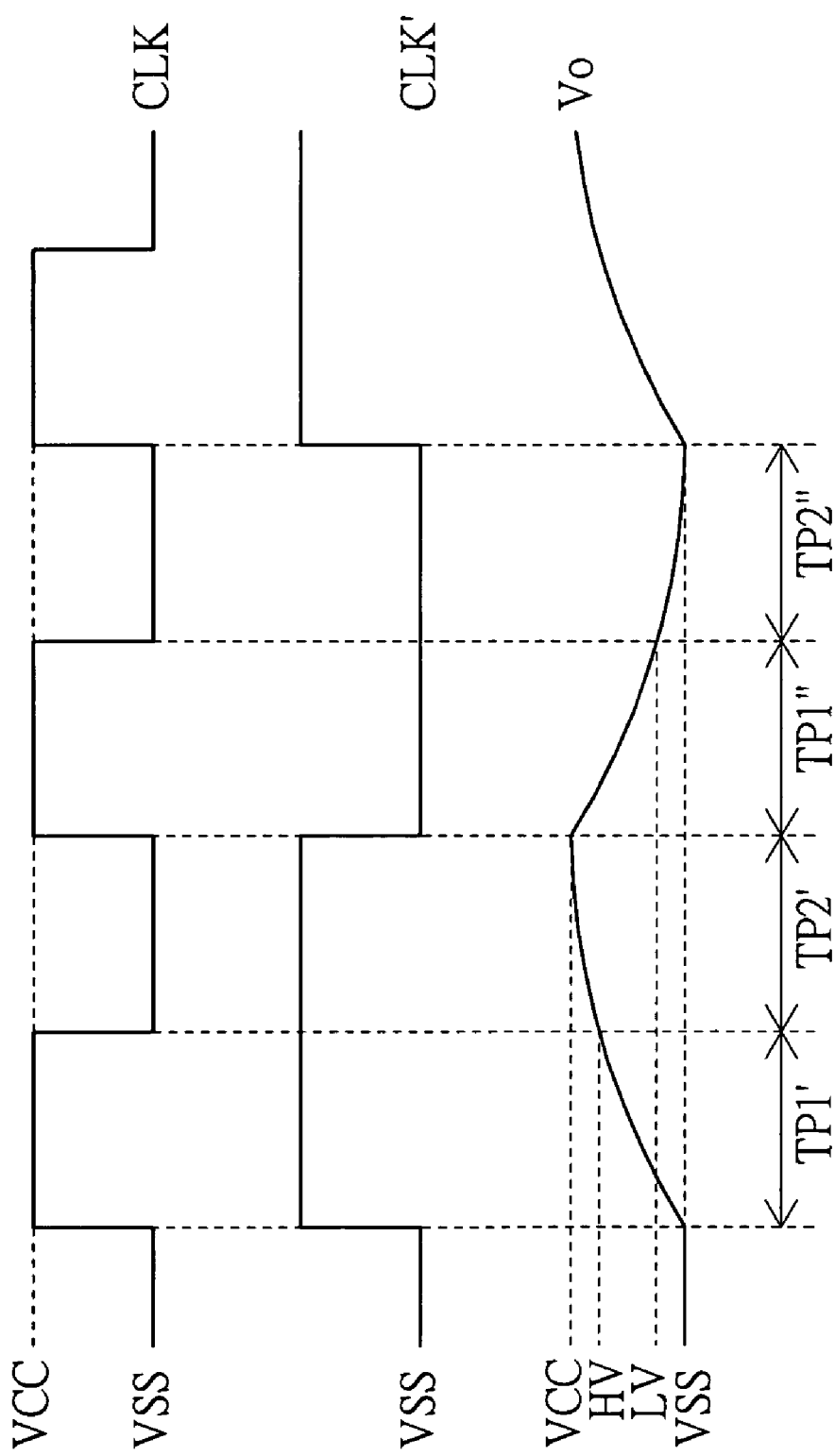
FIG. 6 is a timing chart showing other associated signals of the adjusting circuit of FIG. 1.

FIG. 6 is a timing chart showing other associated signals of the adjusting circuit of FIG. 1. In another operation example, the adjusting circuit 20 provides the high voltage VCC and the low voltage VSS of the clock signal CLK' as the input voltage to the output buffer 10, and the clock signal CLK has a frequency, which is two times that of the clock signal CLK', for example. Consequently, the sample and hold circuit 24 may also perform sampling to obtain the high voltage HV and the low voltage VL in response to the falling edge of the clock signal CLK. In addition, because the frequency of the clock signal CLK' is equal to one half that of the clock signal CLK, the time in which the input voltage Vi is kept at the same voltage (high voltage VCC or low voltage VSS) is doubled. In an operation example, the output voltage Vo is substantially a full swing signal.

In this embodiment, the value determining period of the output buffer 10 is substantially equal to one half of the cycle of the clock signal CLK. However, the value determining period of the output buffer 10 is not limited to a half cycle of the clock signal CLK. For example, the value determining period of the output buffer 10 may also be equal to the cycle of the clock signal CLK. Therefore, the sample and hold circuit 24 is a double edge trigger circuit, for example, and the high voltage VCC or the low voltage VSS of the clock signal CLK' correspondingly serves as the input voltage Vi for the adjusting circuit 20.

For example, the adjusting circuit 20 of this embodiment further has the register circuit 26 for temporarily storing the voltage value VAL generated by the analog-to-digital converter circuit 25. The comparator circuit 28 obtains the voltage value VAL by accessing the register circuit 26, for example.

The input circuit 22 of this embodiment is, for example, a multiplexer circuit for providing the steady-state voltage of the clock signal CLK as the input voltage Vi in response to the first level of the control signal BIST, and providing a voltage of a data signal Si as the input voltage in response to a second level of the control signal BIST.

The adjusting circuit and method of this embodiment adjust the driving ability of the output buffer according to the voltage driving condition of the output buffer in the actual application circuit thereof, and thus effectively set the driving ability of the output buffer to the lowest driving ability for completing the voltage driving in the value determining period. Therefore, compared with the conventional output buffer, the output buffer using the adjusting method and the adjusting circuit according to the invention has the advantages of the lower power noise, the lower power consumption and the lower electromagnetic interference (EMI).

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for adjusting driving ability of an output buffer, the output buffer having a plurality of driving ability classes, the method comprising the steps of:
   (a) initializing the output buffer to have an initial class among the driving ability classes;
   (b) initializing an output terminal of the output buffer to an initial voltage;
   (c) inputting a second clock signal via an input terminal;
   (d) sampling an output voltage outputted from the output terminal to obtain a voltage value at a second time instant in response to a driving edge of a first clock signal;
   (e) judging whether the voltage value satisfies a predetermined condition;
   (f) recording and setting the driving ability class of the output buffer if the voltage value satisfies the predetermined condition, wherein,
   the first clock signal has a frequency that is substantially N times of the second clock signal, and N is an integer greater than 1.

2. The method according to claim 1, further comprising, after the step (e), the step of:
(f) increasing the driving ability class of the output buffer to a second driving ability class and repeating steps (b) to (e) if the voltage value does not satisfy the predetermined condition.

3. The method according to claim 1, wherein the step (e) comprises:
(e1) judging whether the voltage value is substantially higher than an upper-bound voltage value or not while the output voltage is transferring from low voltage to high voltage.

4. The method according to claim 1, wherein the step (e) comprises:
(e1') judging whether the voltage value is substantially lower than a lower-bound voltage value or not while the output voltage is transferring from high voltage to low voltage.

5. The method according to claim 1, wherein the initial class is a lowest driving ability class among the driving ability classes.

6. A buffer module, comprising:
an output buffer, comprising a plurality of sub-buffer units, which are selectively enabled for determining a driving ability class of the output buffer, wherein the output buffer is initialized to have a first driving ability class in response to a first selection signal, so that the output buffer generates an output voltage according to an input voltage based on the first driving ability class; and
a circuit, for determining the driving ability of the output buffer, the circuit comprising:
a sample and hold circuit, coupled to an output terminal of the output buffer, for receiving the output voltage and sampling the output voltage to obtain a voltage value in response to a driving edge of a first clock signal;
a comparator circuit for comparing the voltage value with a threshold voltage value to generate a comparison signal; and
a logic circuit for judging whether the voltage value satisfies a predetermined condition or not according to the comparison signal, when the voltage value satisfies the predetermined condition, the logic circuit provides the first selection signal for keeping the output buffer corresponding to the first driving ability class.

7. The adjusting circuit according to claim 6, further comprising:
an input circuit, coupled to an input terminal of the output buffer, for providing the input voltage to the input terminal of the output buffer, the input circuit comprising:
a multiplexer for providing the input voltage to the output buffer in response to a first level of a control signal, and for providing a data signal to the output buffer in response to a second level of the control signal, wherein the logic circuit provides the control signal having a level equal to the second level when the voltage value satisfies the predetermined condition.

8. The circuit according to claim 6, further comprising:
an analog-to-digital converter circuit for converting the voltage value provided by the sample and hold circuit.

9. The circuit according to claim 8, further comprising:
a register for storing the voltage value, which is converted by the analog-to-digital converter circuit.

10. The circuit according to claim 8, wherein,
the analog-to-digital converter circuit further converts an upper-bound voltage and an lower-bound voltage into a plurality of threshold voltage values, and
the logic circuit further judges whether the voltage values satisfies the predetermined condition or not.

11. The circuit according to claim 10, wherein while the output voltage is transferring from low voltage to high voltage, the predetermined condition is satisfied when the voltage value is higher than the upper-bound voltage.

12. The circuit according to claim 10, wherein while the output voltage is transferring from high voltage to low voltage, the predetermined condition is satisfied when the voltage value is lower than the lower-bound voltage.

13. The circuit according to claim 6, wherein when the voltage value fails to satisfy the predetermined condition, the logic circuit provides a second selection signal, the output buffer is set to have a second driving ability class, and the output buffer generates the output voltage according to the input voltage based on the second driving ability class, wherein,
the sample and hold circuit, the comparator circuit, and the logic circuit further respectively samples the output voltage, which is generated based on the second driving ability class, to obtain the voltage value, compares the voltage value with the threshold voltage value to generate the comparison signal, and judges whether the voltage value satisfies the predetermined condition or not.

14. The circuit according to claim 13, when the voltage value, which corresponds to the second driving ability class, satisfies the predetermined condition, the logic circuit provides the second selection signal for keeping the output buffer corresponding to the second driving ability class.

15. A method applied for adjusting driving ability of an output buffer, the method comprising the steps of:
(a) providing an output buffer comprising a plurality of sub-buffer units, which are selectively enabled for determining a driving ability class of the output buffer;
(b) initializing the output buffer to have a first driving ability class in response to a first selection signal;
(c) initializing an output terminal of the output buffer to an initial voltage;
(d) inputting an input voltage via an input terminal at a first time instant, so that the output buffer generates an output voltage according to an input voltage based on the first driving ability class;
(e) sampling the output voltage to obtain a voltage value at a second time instant;
(f) judging whether the voltage value satisfies a predetermined condition; and
(g) when the voltage value satisfies the predetermined condition, the logic circuit provides the first selection signal for keeping the output buffer corresponding to the first driving ability class.

16. The method according to claim 15, wherein the step (f) comprises:
(f1) judging whether the voltage value is substantially higher than an upper-bound voltage value or not while the output voltage is transferring from low voltage to high voltage.

17. The method according to claim 15, wherein the step (f) comprises:
(f1') judging whether the voltage value is substantially lower than a lower-bound voltage value or not while the output voltage is transferring from high voltage to low voltage.

18. The method according to claim 15, wherein the step (e) comprises:

(e1) sampling the output voltage to obtain the voltage value in response to a driving edge of a first clock signal.

19. The method according to claim 18, wherein the step (d) comprises:

(d1) inputting a second clock signal via the input terminal, wherein the first clock signal has a frequency that is substantially N times of the second clock signal, and N is an integer greater than 1.

20. The method according to claim 15, after the step (f), further comprising:

(g') when the voltage value fails to satisfy the predetermined condition, providing a second selection signal for setting the output buffer to have a second driving ability class; and (h) inputting the input voltage via the input terminal at the first time instant, so that the output buffer generates the output voltage according to the input voltage based on the second driving ability class.

21. The method according to claim 20, wherein after step (h), steps (c) to (f) are repeated to determine whether the voltage value, which is corresponding to the second driving ability class, satisfies the predetermined condition.

\* \* \* \* \*